(12) United States Patent
Lin et al.

(10) Patent No.: US 12,181,517 B2
(45) Date of Patent: Dec. 31, 2024

(54) METHOD FOR DETECTING MEMORY CHIP

(71) Applicant: NANYA TECHNOLOGY CORPORATION, New Taipei (TW)

(72) Inventors: Yan-De Lin, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 588 days.

(21) Appl. No.: 17/446,986

(22) Filed: Sep. 7, 2021

(65) Prior Publication Data
US 2023/0071925 A1 Mar. 9, 2023

(51) Int. Cl.
*G01R 31/28* (2006.01)
*G01R 31/52* (2020.01)
*G11C 11/401* (2006.01)

(52) U.S. Cl.
CPC ..... *G01R 31/2893* (2013.01); *G01R 31/2896* (2013.01); *G01R 31/52* (2020.01); *G11C 11/401* (2013.01)

(58) Field of Classification Search
CPC .......... G11C 29/006; G11C 2029/4402; G11C 2029/5002; G11C 11/401; G01R 31/2893; G01R 31/2896; G01R 31/52
See application file for complete search history.

(56) References Cited

U.S. PATENT DOCUMENTS 9,502,299 B2 * 11/2016 Hishida ........... H01L 21/823437
9,548,129 B2 * 1/2017 Paudel .................... G11C 29/44
10,811,095 B2 * 10/2020 Miyazaki ........... G11C 13/0038

* cited by examiner

*Primary Examiner* — Paul D Kim
(74) *Attorney, Agent, or Firm* — CKC & Partners Co., LLC

(57) ABSTRACT

A method for detecting a memory chip includes the following steps coupling a detecting circuit to a first area and a second area of the memory chip, the second area is not overlapped with the first area; inputting a first detecting signal from the detecting circuit to the first area of the memory chip; burning out a cell of the detecting circuit; and inputting a second detecting signal from the detecting circuit to the second area of the memory chip.

7 Claims, 7 Drawing Sheets

METHOD FOR DETECTING MEMORY CHIP

BACKGROUND

Field of Invention

The present disclosure relates to a detecting circuit and a method for detecting a circuit. More particularly, the present disclosure relates to a detecting circuit and a method for detecting a memory chip.

Description of Related Art

In conventional technology, Focused Ion Beam (FIB) circuit editing is used in memory chips in order to realize a leakage current of word lines or bit lines. FIB circuit editing is a process in which a focused ion beam is used to modify logic or interconnects on a circuit wafer or memory chips.

Due to a focused ion beam of FIB circuit editing, word lines or bit lines of a memory chip from edge to center are burned out to do electrical characteristic analysis. However, the use of a focused ion beam causes a circuit wafer or memory chips broken. Therefore, practitioners cannot know that a leakage current is generated from a circuit wafer or memory chips.

For the foregoing reason, there is a need to provide some other a detecting methods to solve the problems of the prior art.

SUMMARY

One aspect of the present disclosure provides a method for detecting a memory chip. The method includes the following steps: coupling a detecting circuit to a first area and a second area of the memory chip, wherein the second area is not overlapped with the first area; inputting a first detecting signal from the detecting circuit to the first area of the memory chip; burning out a cell of the detecting circuit; and inputting a second detecting signal from the detecting circuit to the second area of the memory chip.

Another aspect of the present disclosure provides a detecting circuit for detecting a memory chip. The detecting circuit includes an input pad and a cell. The input pad is coupled to a first area of the memory chip. The input pad is configured to input a first detecting signal to the first area of the memory chip. The cell is coupled to the input pad and a second area of the memory chip. The second area is not overlapped with the first area. The cell is burned out such that the input pad inputs a second detecting signal to the second area of the memory chip.

These and other aspects of the present disclosure will become apparent from the following description of the preferred embodiment taken in conjunction with the following drawings, although variations and modifications therein may be effected without departing from the spirit and scope of the novel concepts of the disclosure.

It is to be understood that both the foregoing general description and the following detailed description are by examples, and are intended to provide further explanation of the present disclosure as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
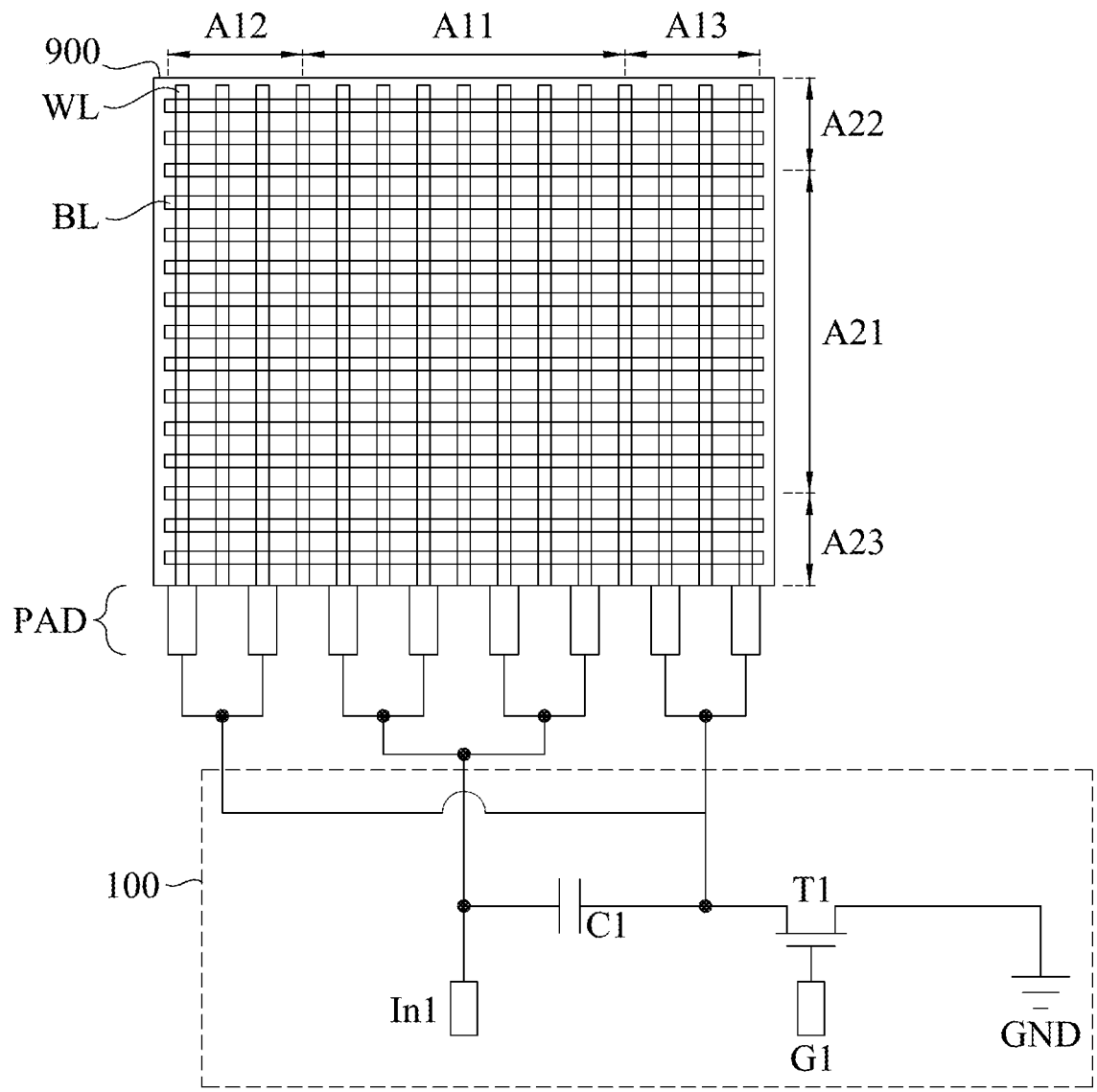
FIG. 1 depicts a schematic diagram of a memory chip and a detecting circuit according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 depicts a schematic diagram of a memory chip 900 and a detecting circuit 100 according to one embodiment of the present disclosure. In some embodiments, please refer to FIG. 1, the memory chip 900 includes word lines WL (all vertical lines represent word line shown in the figure) and bit lines BL (all horizontal lines represent bit line shown in the figure). In some embodiments, the word lines are perpendicular the bit lines. In some embodiments, the memory chip 900 includes 2D-array memory and 3D memory. In some embodiments, the memory chip 900 includes a dynamic random access memory (DRAM).

In some embodiments, the detecting circuit 100 includes an input pad In1, a cell C1, and a switch T1. The input pad In1 is coupled to the memory chip 900. Please start form a top end and a right end of each of an element shown in the figure as a first end, the cell C1 includes a first end and a second end. The first end is coupled to the memory chip 900. The second end of the cell C1 is coupled to the input pad In1.

In some embodiments, a switch T1 includes a first end, a second end, and a control end. The first end of the switch T1 is coupled to ground GND. The second end of the switch T1 is coupled to the cell C1 and the memory chip 900. The control end of the switch T1 is coupled to gate pad G1. The switch T1 responses a control signal of the gate pad G1 to be turned on or to be turned off. The switch T1 includes a p-type MOSFET or a n-type MOSFET.

In some embodiments, detecting pads PAD between the detecting circuit 100 and the memory chip 900 is configured to transmit detecting signals in an unidirectional transmission or an bidirectional transmission. In some embodiments, the detecting pads PAD are coupled to the detecting circuit 100 and the memory chip 900. The detecting pads PAD are configured to return detecting results of the detecting signals back to the input pad In1.

Figure 2:
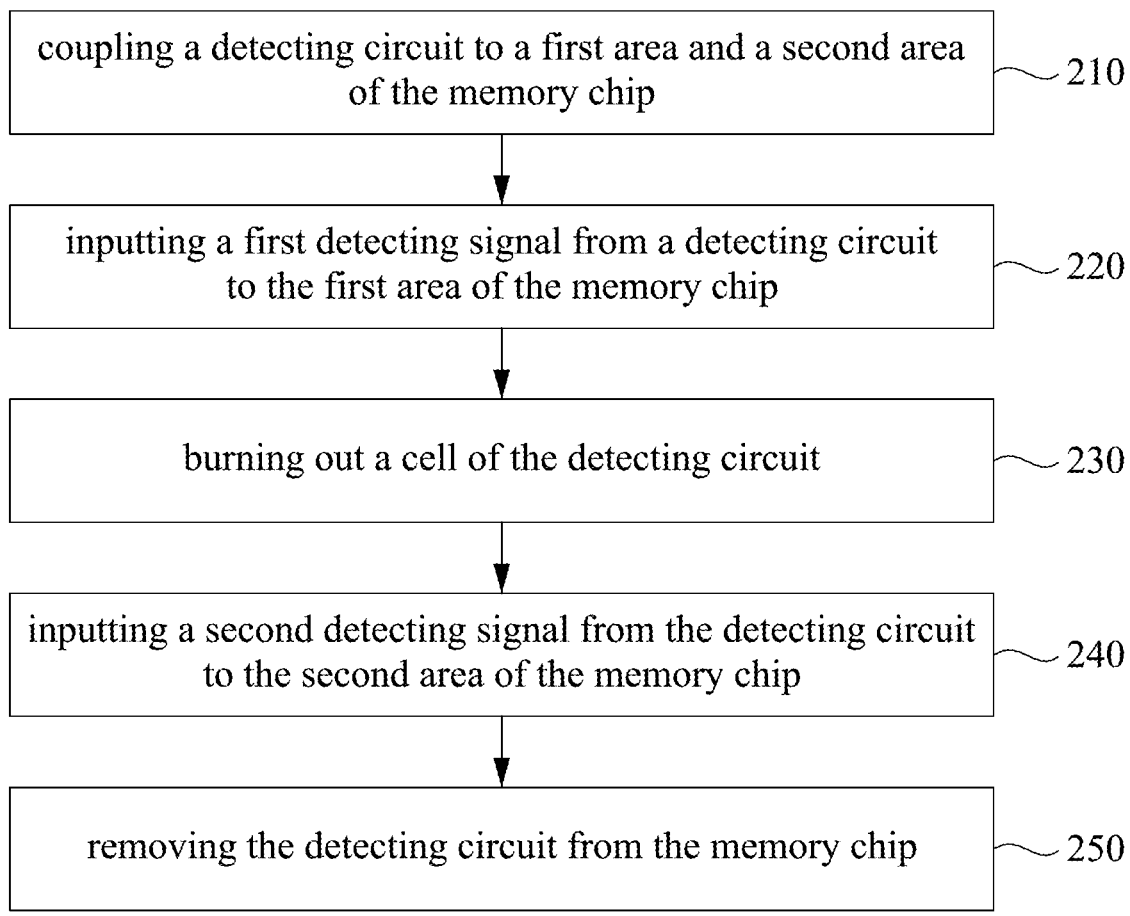
FIG. 2 depicts a flow chart of a method for detecting a memory chip according to one embodiment of the present disclosure.
Figure 3:
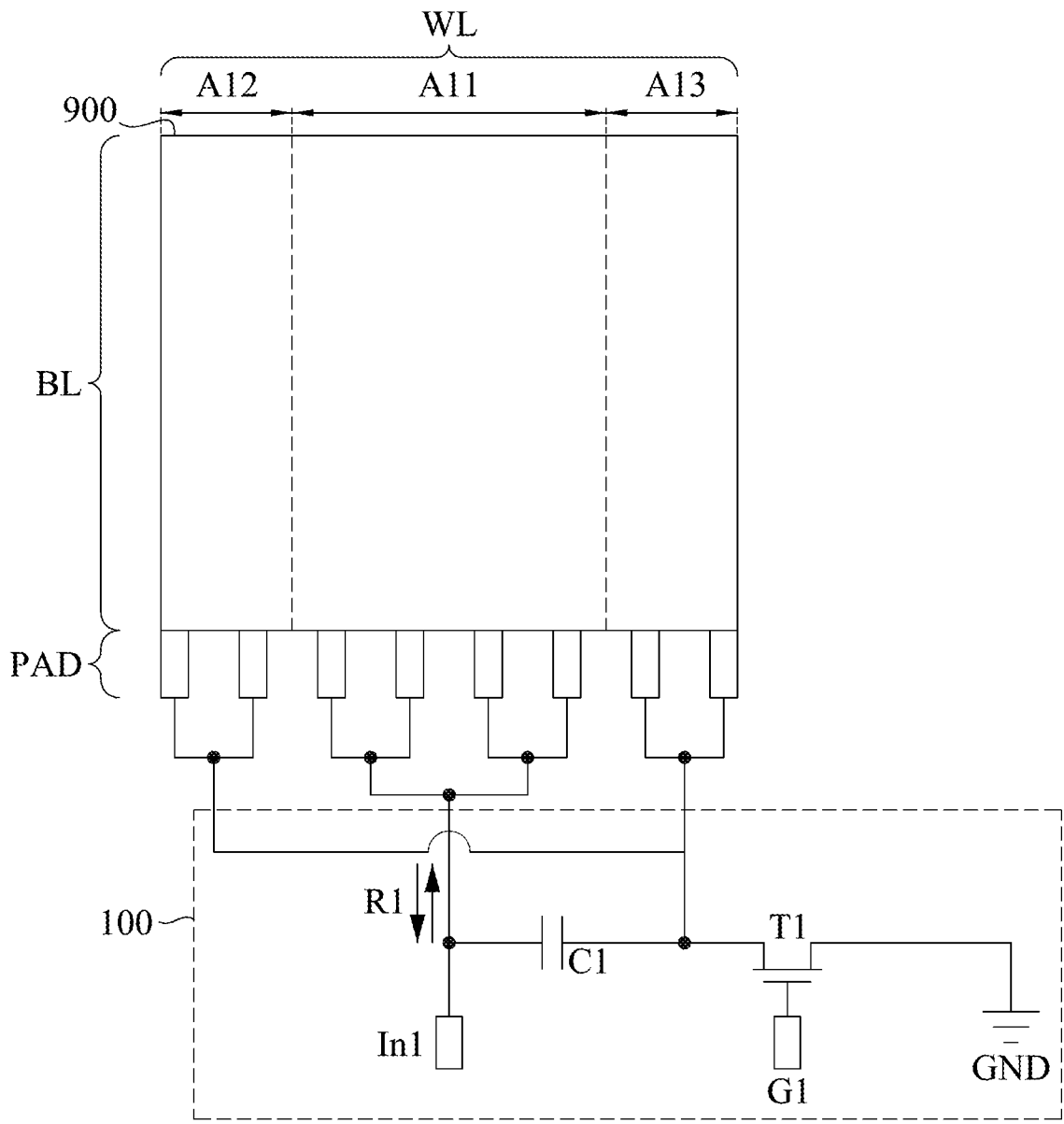
FIG. 3 depicts a state diagram of a memory chip and a detecting circuit according to one embodiment of the present disclosure.
Figure 4:
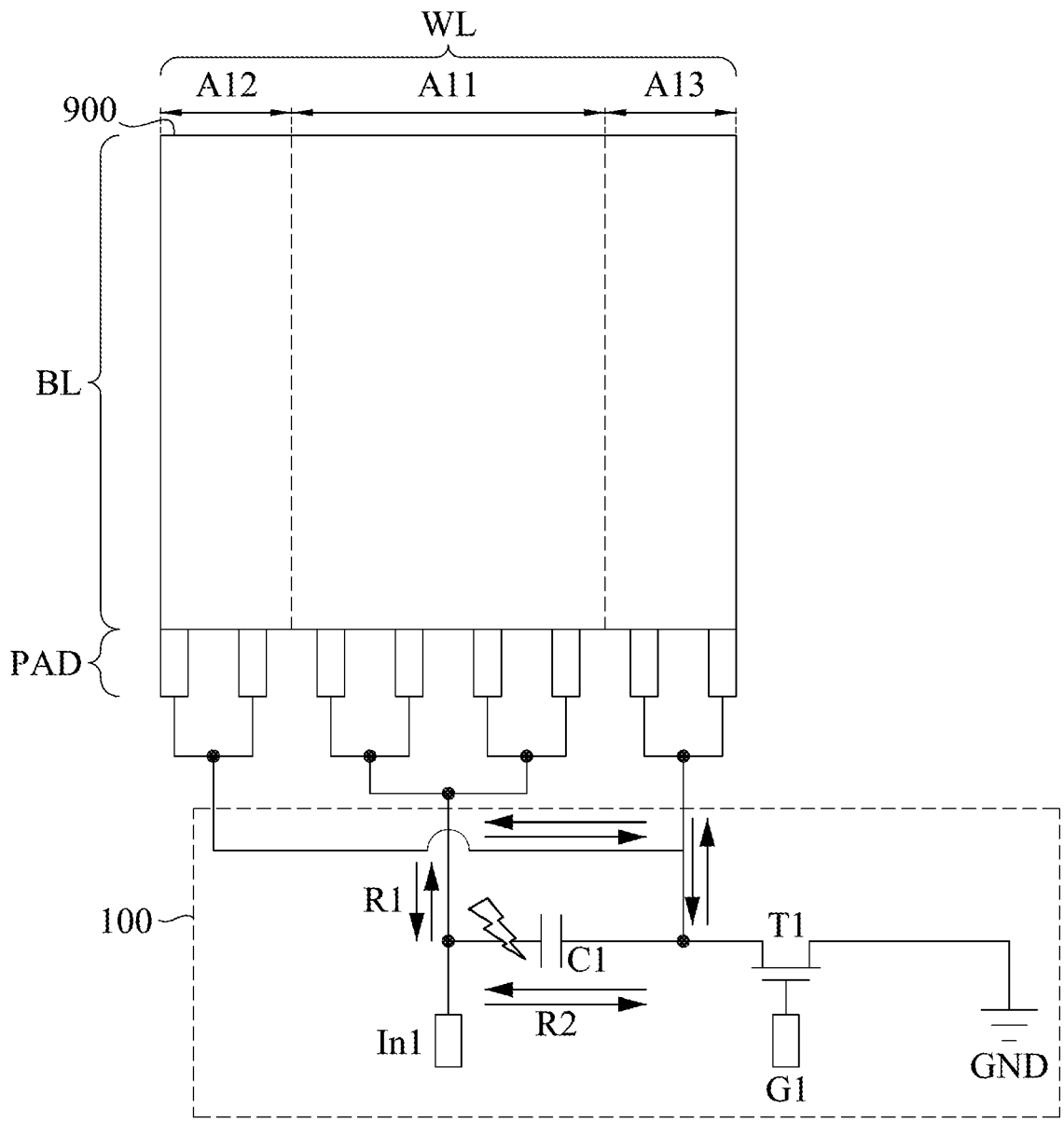
FIG. 4 depicts a state diagram of a memory chip and a detecting circuit according to one embodiment of the present disclosure.

In some embodiments, in order to facilitate the understanding of a detecting circuit 100 for detecting a memory chip 900 shown in FIG. 1. Please refer to FIG. 2 to FIG. 4. FIG. 2 depicts a flow chart of a method 200 for detecting a memory chip according to one embodiment of the present disclosure. FIG. 3 and FIG. 4 depict a state diagram of a memory chip 900 and a detecting circuit 100 according to one embodiment of the present disclosure. It is noted that the embodiments of FIG. 3 and FIG. 4 are that the detecting circuit 100 is configured to detect the word lines WL of the memory chip 900 independently. The memory chip 900 shown in FIG. 3 is corresponding to the memory chip 900 shown in FIG. 1. The method 200 for detecting a memory chip includes the following step:

In step 210, coupling a detecting circuit to a first area and a second area of the memory chip.

In some embodiments, please refer to FIG. 2 and FIG. 3, the input pad In1 of the detecting circuit 100 is coupled to a first area A11 and a second area (e.g. an area A12 and an area A13). The second area (e.g. an area A12 and an area A13) is not overlapped with the first area A11. In detail, the first area A11 is in the central area of word lines. The area A12 and the area A13 are on the both sides of the first area A11. It is noted that a size and a length of each of the area A11, the area A12, and the area A13 is not limited to the embodiment in the figure.

In step 220, inputting a first detecting signal from a detecting circuit to the first area of the memory chip.

In some embodiments, the input pad In1 is configured to input a first detecting signal from the detecting circuit 100 to the first area A11 of the memory chip 900 along a route R1 shown in FIG. 3. The detecting pads PAD return a first result of the first detecting signal back to the input pad In1. The input pad In1 is configured to determine whether the first area A11 of the memory chip 900 is normal or not according to the first result of the first detecting signal. At this time, the switch T1 responses a control signal of the gate pad G1 to be turned off.

In step 230, burning out a cell of the detecting circuit. In some embodiments, please refer to FIG. 2 and FIG. 4, the cell C1 is burned out to be a short circuit along a route R2 shown in FIG. 4. At this time, the switch T1 responses controls of the gate pad G1 to be turned on so as to be a resistance such that signals from the input pad In1 can be transmitted to the second area (the area A12 and the area A13) of the memory chip 900. It is noted that a lightning symbol means the cell C1 is burned out and cannot be restored or recovered.

In step 240, inputting a second detecting signal from the detecting circuit to the second area of the memory chip.

In some embodiments, please refer to FIG. 2 and FIG. 4, the input pad In1 is configured to input a second detecting signal from the detecting circuit 100 to the second area (the area A12 and the area A13) of the memory chip 900 along a route R2 shown in FIG. 4. The detecting pads PAD return a second result of the second detecting signal back to the input pad In1. The input pad In1 is configured to determine whether the second area (the area A12 and the area A13) of the memory chip 900 is normal or not according to the second result of the second detecting signal.

In step 250, removing the detecting circuit from the memory chip.

In some embodiments, the detecting circuit 100 is removed from the memory chip during a manufacturing process of the memory chip 900. In detail, the detecting circuit 100 is removed during a detecting process of rear section of the manufacturing process of the memory 900.

Figure 5:
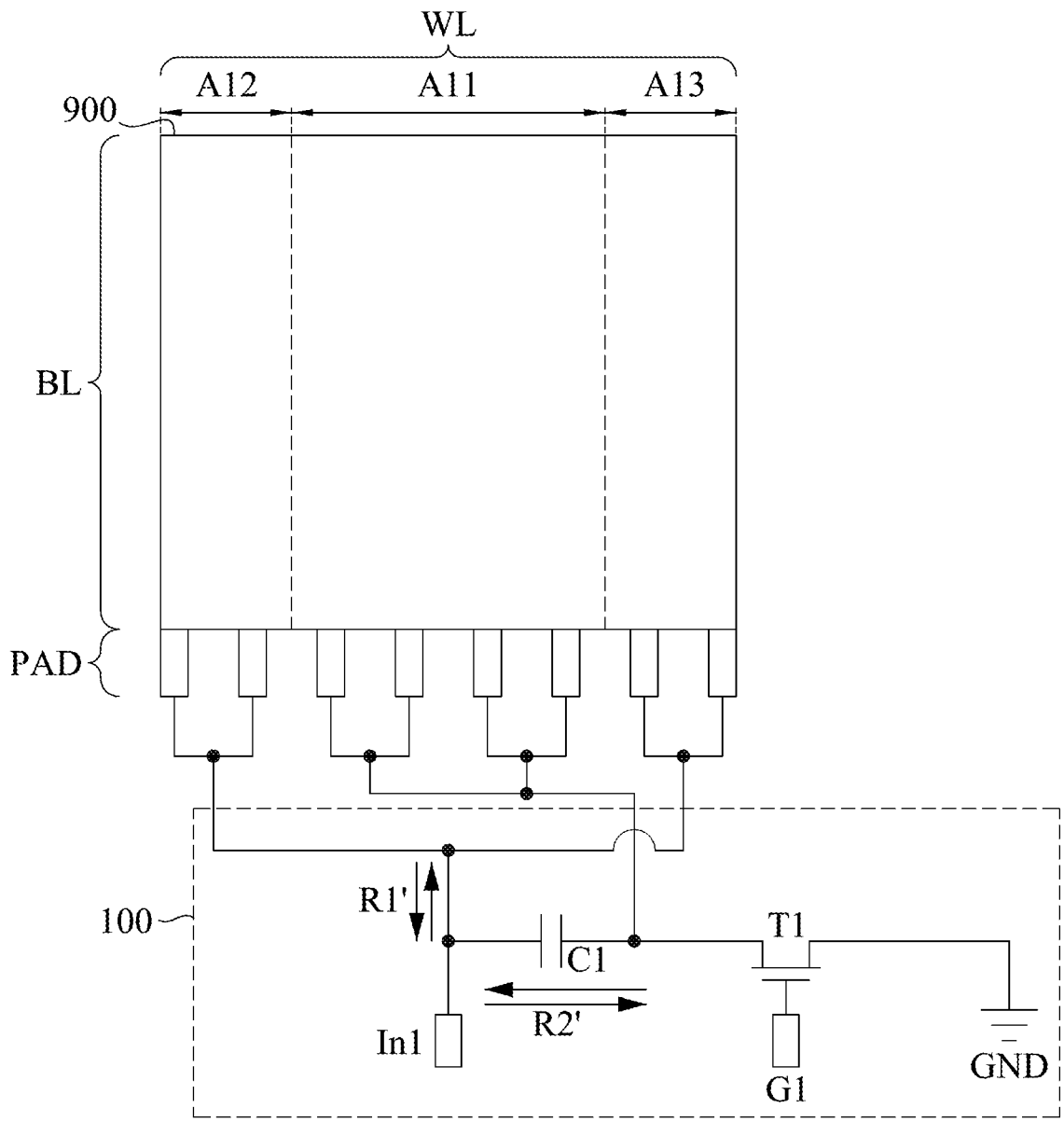
FIG. 5 depicts a state diagram of a memory chip and a detecting circuit according to one embodiment of the present disclosure.

FIG. 5 depicts a state diagram of a memory chip 900 and a detecting circuit 100 according to one embodiment of the present disclosure. In some embodiments, compared with FIG. 3 and FIG. 4, a different between embodiments in FIG. 5 and embodiments in FIG. 3 and FIG. 4 is that circuit connections of the detecting circuit 100 and the memory chip 900 are changed. In detail, the detecting circuit 100 is coupled to a first area A11 along a route R2' and a second area (e.g. an area A12 and an area A13) along a route R1'.

In this embodiment, a difference from the aforementioned step 220 is that the input end In1 of the detecting circuit 100 is configured to input the first detecting signal from the detecting circuit 100 to the second area (e.g. an area A12 and an area A13) along the route R1'. In this embodiment, another difference from the aforementioned step 240 is that the input end In1 of the detecting circuit 100 is configured to input the second detecting signal from the detecting circuit 100 to the first area A11 along the route R2'. The rest of steps are the same, and repetitious details are omitted herein.

Figure 6:
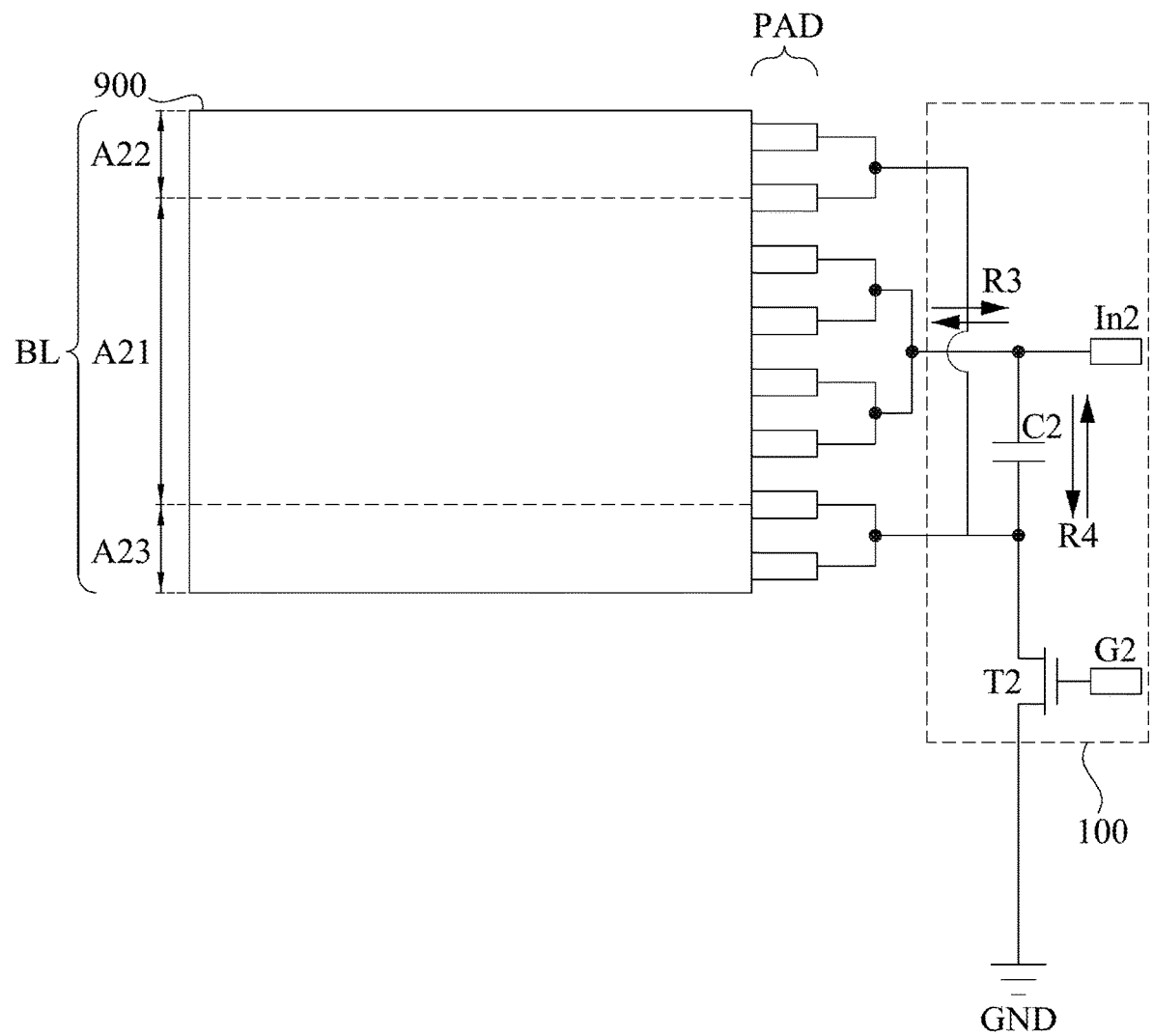
FIG. 6 depicts a schematic diagram of a memory chip and a detecting circuit according to one embodiment of the present disclosure.

FIG. 6 depicts a schematic diagram of a memory chip 900 and a detecting circuit 100 according to one embodiment of the present disclosure. Compared with FIG. 3 and FIG. 4, the embodiments of FIG. 6 are that the detecting circuit 100 is configured to detect the bit lines BL of the memory chip 900 independently. The memory chip 900 shown in FIG. 6 is corresponding to the memory chip 900 shown in FIG. 1.

In some embodiments, please refer to FIG. 6, the input pad In2 of the detecting circuit 100 shown in FIG. 6 is coupled to an area A21 of bit lines BL of the memory chip 900 along a route R3. The input pad In2 of the detecting circuit 100 shown in FIG. 6 is coupled to an area A22 and an area A23 of bit lines BL of the memory chip 900 along a route R4. In detail, the area A21 is in the central area of bit lines. The area A22 and the area A23 are on the both sides of the area A21. It is noted that a size and a length of each of the area A21, the area A22, and the area A23 is not limited to the embodiment in the figure.

Figure 7:
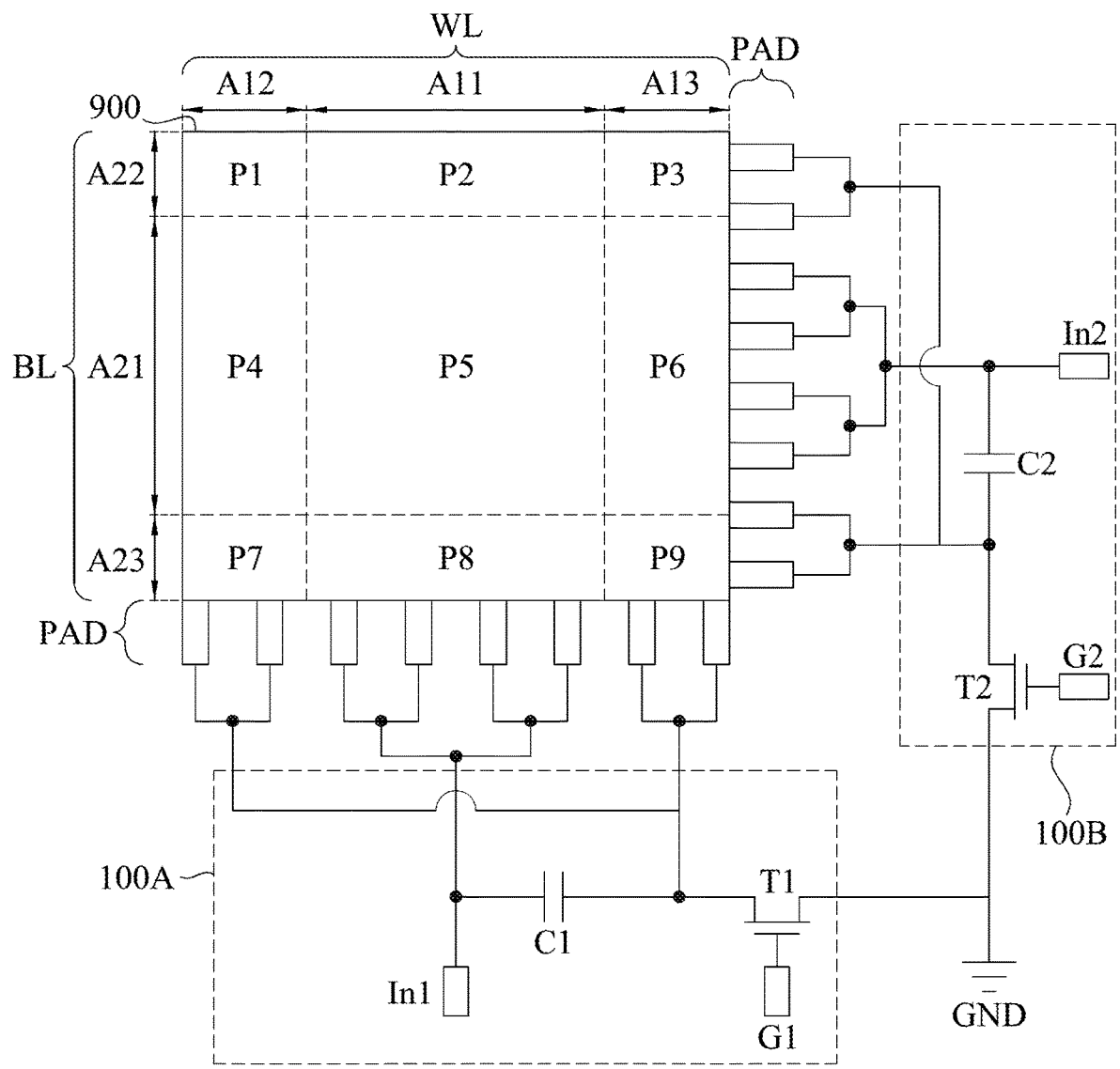
FIG. 7 depicts a schematic diagram of a memory chip and two detecting circuit according to one embodiment of the present disclosure.

FIG. 7 depicts a schematic diagram of a memory chip 900 and two detecting circuit 100A and 100B according to one embodiment of the present disclosure. A different between the embodiments of FIG. 3, FIG. 4, FIG. 5, and FIG. 6 and the embodiments of FIG. 7 is that a number of the detecting circuit is changed. The detecting circuit includes a first detecting circuit 100A and a second detecting circuit 100B. The first detecting circuit 100A and the second detecting circuit 100B are coupled to the memory chip 900. The first detecting circuit 100A and the second detecting circuit 100B shown in FIG. 7 are the same as the detecting circuit 100 in FIG. 1, FIG. 3 to FIG. 6.

It is noted that the word lines WL and the bit lines BL of the memory chip 900 can be detected by the first detecting circuit 100A and the second detecting circuit 100B simultaneously. In detail, the first detecting signal and the second signal are inputted into the memory chip 900 simultaneously. The first detecting signal and the second signal do not interfere with each other.

In some embodiments, as shown in FIG. 7, the word lines WL and the bit lines BL form a grid matrix (e.g. a 3×3 square matrix shown in FIG. 7) in the memory chip. The grid matrix includes nine grids. An arrangement order of nine grids from left to right and top to bottom is a first grid P1, a second grid P2, a third grid P3, a fourth grid P4, a fifth grid P5, a sixth grid P6, a seventh grid P7, an eighth grid P8, and a ninth grid P9. In some embodiments, the grid matrix includes a first part (e.g. the fifth grid P5) and a second part (e.g. the grids P1-P4 and P6-P9). The second part surrounds the first part. The first part and the second part are not overlapped with each other.

In some embodiments, the area A12 of the word lines WL and the area A22 of the bit lines BL are partially overlapped to form the first grid P1. The area A11 of the word lines WL and the area A22 of the bit lines BL are partially overlapped to form the second grid P2. The area A13 of the word lines WL and the area A22 of the bit lines BL are partially overlapped to form the third grid P3.

In some embodiments, the area A12 of the word lines WL and the area A21 of the bit lines BL are partially overlapped to form the fourth grid P4. The area A11 of the word lines WL and the area A21 of the bit lines BL are partially overlapped to form the fifth grid P5. The area A13 of the word lines WL and the area A21 of the bit lines BL are partially overlapped to form the sixth grid P6.

In some embodiments, the area A12 of the word lines WL and the area A23 of the bit lines BL are partially overlapped to form the seventh grid P7. The area A11 of the word lines WL and the area A23 of the bit lines BL are partially overlapped to form the eighth grid P8. The area A13 of the word lines WL and the area A23 of the bit lines BL are partially overlapped to form the ninth grid P9. It is noted that a shape and a size of each of the nine grids is not limited to the embodiments in the figure. In some embodiments, a leakage current of the memory chip 900 can be inferred according to detecting results of the nine grids.

In some embodiments, the circuit connections between the first detecting circuit 100A and the memory chip 900 can be designed according to actual needs. The circuit connections between the first detecting circuit 100B and the memory chip 900 can be designed according to actual needs.

In some embodiments, as shown in FIG. 7, the first part is actually a central part of the memory chip 900, and the second part is actually a peripheral part of the memory chip 900. It is noted that a shape and a size of each of the peripheral part and the central part is not limited to the embodiments in the figure.

It is noted that the detecting circuit and method for detecting a memory chip of the present disclosure is mainly configured to detect the central part and the peripheral part of the memory chip 900 to determine each of the central part and the peripheral part of the memory chip 900 are normal or not. Furthermore, the word lines and the bit lines of the memory chip can be detected simultaneously such that detecting time for memory chip can be saved.

Based on the above embodiments, the present disclosure provides a detecting circuit and a method for detecting a memory chip so as to save time and cost of a detecting process of the manufacturing process of the memory chip and protect the memory chip from damage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for detecting a memory chip, comprising:
   coupling a detecting circuit to a first area and a second area of the memory chip, wherein the second area is not overlapped with the first area;
   inputting a first detecting signal from the detecting circuit to the first area of the memory chip;
   burning out a cell of the detecting circuit; and
   inputting a second detecting signal from the detecting circuit to the second area of the memory chip.

2. The method for detecting the memory chip of claim 1, wherein inputting the first detecting signal from the detecting circuit to the first area of the memory chip comprises:
   determining whether the first area of the memory chip is normal or not.

3. The method for detecting the memory chip of claim 2, wherein inputting the second detecting signal from the detecting circuit to the second area of the memory chip comprises:
   determining whether the second area of the memory chip is normal or not.

4. The method for detecting the memory chip of claim 1, further comprising:
   turning on a switch of the detecting circuit to be a resistance such that the second detecting signal is transmitted to the second area of the memory chip according a control signal.

5. The method for detecting the memory chip of claim 1, further comprising:
   removing the detecting circuit from the memory chip during a manufacturing process.

6. The method for detecting the memory chip of claim 1, wherein the memory chip comprises word lines and bit lines, wherein inputting the first detecting signal from the detecting circuit to the first area of the memory chip comprises:
   inputting the first detecting signal to the word lines and inputting the first detecting signal to the bit lines independently.

7. The method for detecting the memory chip of claim 1, wherein the memory chip comprises word lines and bit lines, wherein inputting the first detecting signal from the detecting circuit to the first area of the memory chip comprises:
   inputting the first detecting signal to the word lines and inputting the first detecting signal to the bit lines simultaneously.

* * * * *